United States Patent [19]
Chan

[11] Patent Number: 5,140,268
[45] Date of Patent: Aug. 18, 1992

[54] METHOD AND MEANS FOR CORRECTING RF AMPLIFIER DISTORTION IN MAGNETIC RESONANCE IMAGING

[75] Inventor: Frandics P. Chan, Stanford, Calif.

[73] Assignee: The Board of Trustees of the Leland Stanford Junior University, Stanford, Calif.

[21] Appl. No.: 539,013

[22] Filed: Jun. 15, 1990

[51] Int. Cl.$^5$ .............................................. G01R 33/20
[52] U.S. Cl. ..................................... 324/314; 324/309;
324/307
[58] Field of Search ................... 324/307, 309, 314;
330/149

[56] References Cited

U.S. PATENT DOCUMENTS

| | | |
|---|---|---|
| 4,694,254 | 9/1987 | Vatis et al. ............................ 324/309 |
| 4,736,328 | 4/1988 | Vatis et al. ............................ 324/314 |
| 4,933,626 | 6/1990 | Halbach et al. ...................... 323/280 |

*Primary Examiner*—Hezron E. Williams
*Assistant Examiner*—William Francos
*Attorney, Agent, or Firm*—Henry K. Woodward

[57] ABSTRACT

In a magnetic resonance imaging system, an RF power amplifier is employed to boost an RF pulse to sufficient strength to excite the nuclear spins in a subject. The non-ideal behavior of the amplifier distorts the shape of an excitation pulse, and this distortion in turn degrades a slice profile. The distortion of the RF signal is manifested by nonlinearity in amplification and in incidental phase modulation. By determining the amount of nonlinearity and the phase modulation resulting from the power amplification, the baseband RF signal can be predistorted or prewarped to offset the distortion resulting from amplification. Improved slice selectivity results therefrom.

15 Claims, 10 Drawing Sheets

METHOD AND MEANS FOR CORRECTING RF AMPLIFIER DISTORTION IN MAGNETIC RESONANCE IMAGING

BACKGROUND OF THE INVENTION

This invention relates generally to magnetic resonance imaging (MRI), and more particularly the invention relates to improving image slice selection by correcting RF amplifier distortion.

In MRI, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example at 90° or 180°. After excitation the nuclei gradually return to with the static field and give up the energy in the form of weak but detectable free induction decay (FID). These FID signals are used by a computer to produce images.

The excitation frequency, ant he FID frequency, is defined by the Larmor relationship which states that the angular frequency $\omega_0$, of the precession of the nuclei is the product of the magnetic field $B_0$, and the so-called magnetogyric ratio, $\gamma$, a fundamental physical constant for each nuclear species:

$$\omega_0 = B_0 \cdot \gamma.$$

Accordingly, by superimposing a linear gradient field, $B_z = z \cdot G_z$, on the static uniform field $B_0$, which defines Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation is proportional to the integral of the pulse over time.

In the magnetic resonance imaging system, a radiofrequency (RF) power amplifier is employed to boost an RF pulse to sufficient strength to excite the nuclear spins in a subject. In the design of the amplifier, precision is often compromised in favor of power output and efficiency. Consequently, a fair amount of distortion can be introduced into a selective-excitation pulse, and this in turn degrades the definition of a slice profile by widening transition widths, reducing in slice flatness, and increasing out-of-slice signal. Poor profile of definition adversely effects imaging such as multi-slice, MR angiography, and two-dimensional excitation imaging.

SUMMARY OF THE INVENTION

Accordingly, an object of the present invention is improved MRI slice selection definition.

Another object of the invention is enhanced slice profile by reducing transition widths, increasing in slice flatness, and decreasing out-of-slice signal.

Briefly, in accordance with the invention two types of RF signal distortion, gain nonlinearity and incidental phase modulation, are identified and offset by pre-warping the RF signal prior to amplification. Both types of distortion are functions of the input signal as applied in specific MRI systems.

More particularly, the relationship of an amplifier baseband signal, $y(t)$, to the input baseband signal, $x(t)$ is $$y(t) = Hx(t)$$

where H is the baseband gain function. However, nonlinearity and incidental phase modulation exists whereby H varies depending on the input signal. Because the bandwidth of the input signal is narrow, H depends only on the instantaneous magnitude of $x(t)$. Therefore if $x(t)$ is decomposed into its magnitude component $X_m(t)$ and its phase component $\phi_x(t)$ such that $$x(t) = x_{m(t)} e^{i\phi_x(t)}$$

the above equation can be re-written as $$y(t) = H(x_m) x(t)$$

The magnitude component of the baseband gain function $H(x_m)$ characterizes the nonlinearity of the RF amplifier, and the phase component characterizes the incidental phase modulation of the amplifier.

Using this equation as a model, a predistorted pulse is found which is compensated for the distortion of the RF amplifier. This is accomplished in accordance with the invention in two steps. First, the baseband gain function of a given RF amplifier is measured by controlling the baseband component of the amplifier input and observing the baseband component of the amplifier output. Second, a given selective-excitation pulse is prewarped by solving the following expression for $x(t)$, $$y(t) = H(x_m) x(t).$$

By prewarping the RF signal prior to amplification, no performance penalties such as gain loss, instability, and band limitation are incurred. Since the signal transmitted by the MR transceiver is highly repetitive, prewarping is economical since the prewarped RF pulse is used over and over again during a scan. Further, a family of pulses can be prewarped at different output levels for latter selection for a particular scan.

The invention and objects and features thereof will be more readily apparent from the following detailed description and appended claims when taken with the drawing.

DETAILED DESCRIPTION OF ILLUSTRATIVE EMBODIMENTS

Figure 1:
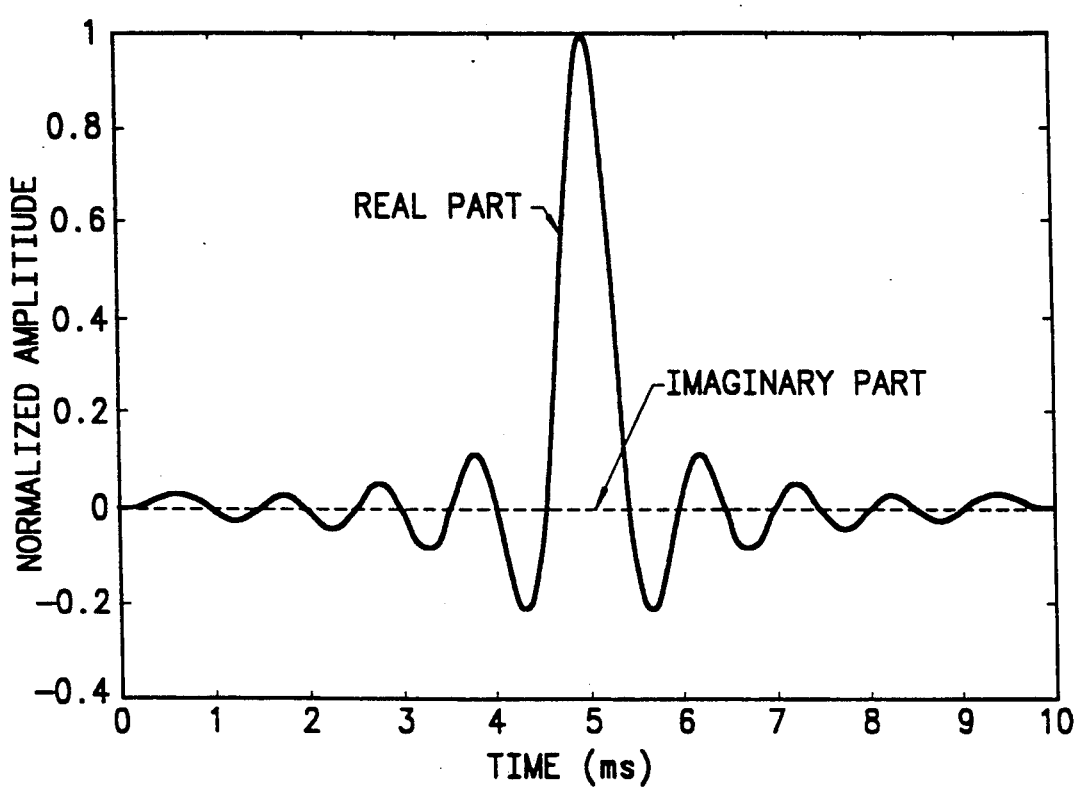
FIG. 1 is a plot of a standard 90° RF selective-excitation pulse as used in MRI.

In accordance with the invention the distortion in an amplified RF signal as used in MRI is reduced or eliminated by pre-warping the RF signal prior to amplification. Two types of distortion have been identified: nonlinearity and incidental phase modulation. Nonlinearity refers to a fluctuation of the amplifier gain that depends on the input signal. Incidental phase modulation refers to an unwanted phased shift that also depends on the input signal.

Begin by defining a baseband gain function which quantitatively describes both nonlinearity and incidental phase modulation. Next, demonstrate what impact nonlinearity and incidental phase modulation, embodied in the baseband gain function, have on one-dimensional slice profiles. Then outline the procedures for the measurement of this function and for the prewarping of a selective-excitation pulse. By way of examples, carry out these procedures on an existing MR imaging system and demonstrate that prewarping is an effective and practical means to correct the distortion.

An RF pulse is normally generated with quadrature amplitude modulation (QAM), where a carrier at frequency $\omega_0$ is modulated by a baseband complex signal $x(t)$ (bold type is used throughout to denote complex quantities) to yield an RF signal $x(t)$. This RF signal can be written as, $$x(t) = \text{Re}\{\mathbf{x}(t)e^{-\omega_0 t}\} \quad [1].$$

As used herein, a selective-excitation pulse is synonymous to the baseband signal $\mathbf{x}(t)$ while an RF pulse is synonymous to the RF signal $x(t)$. An RF amplifier takes in the RF signal $x(t)$ and produces an amplified signal $y(t)$. Like Eq. [1], $y(t)$ can be decomposed into a baseband signal $\mathbf{y}(t)$ and a carrier as, $$y(t) = \text{Re}\{\mathbf{y}(t)e^{-\omega_0 t}\} \quad [2].$$

Define a baseband gain function $H$ which relates the baseband component $\mathbf{x}(t)$ of the amplifier input to the baseband component of the amplifier output $\mathbf{y}(t)$ as, $$\mathbf{y}(t) = H\mathbf{x}(t) \quad [3].$$

Note that the magnitude component of $H$ corresponds to the multiplicative gain of the amplifier while the phase component corresponds to the additive phase shift. If an RF amplifier were perfect, then the baseband gain function $H$ would be a constant. However, if nonlinearity or incidental phase modulation exists, $H$ varies depending on the input signal. Because the bandwidth of the input signal is narrow, $H$ depends only on the instantaneous magnitude of $\mathbf{x}(t)$ and not on the history of $\mathbf{x}(t)$. So if we decompose $\mathbf{x}(t)$ into its magnitude component $x_m(t)$ and its phase component $\phi_x(t)$ such that, $$\mathbf{x}(t) = x_m(t)e^{i\phi_x(t)} \quad [4].$$

Rewrite Eq. [3] as, $$\mathbf{y}(t) = H(x_m)\mathbf{x}(t) \quad [5].$$

The magnitude component of the baseband gain function $H(x_m)$ characterizes the nonlinearity of the RF amplifier, and the phase component characterizes the incidental phase modulation of the amplifier. We should emphasize that the nonlinearity here refers to an uneven amplification of the baseband signal $\mathbf{x}(t)$, not the RF signal $x(t)$.

Another mode of distortion results from the RF amplifier gradually losing proven output during a prolonged unblanking. This mode is termed drooping. A measure of the drooping distortion can be readily obtained by assuming that the time-dependance (drooping) is separable from the magnitude dependence (nonlinearity). A repetitive time-varying signal is applied to the amplifier input, and the amplified output is measured to determine the droop in the amplifier gain over time.

Consider now the changes in a slice profile under simulated nonlinearity and incidental phase modulation. FIG. 1 shows a 90° selective-excitation pulse which we will use as a standard pulse in all subsequent simulations and experiments. The pulse is designed with the Shinnar-Le Roux equiripple algorithm and its attributes are listed in Table 1:

TABLE 1

| Attributes of the Standard Pulse | |
|---|---|
| Flip Angle | 90° |
| Bandwidth | 2000 Hz |
| Transition Width/Bandwidth Ratio | 0.1 |
| In-slice Ripple | 0.3% |
| Out-of-slice Ripple | 0.3% |
| Samples | 512 |
| Pulse Duration | 10 ms |

Figure 2:
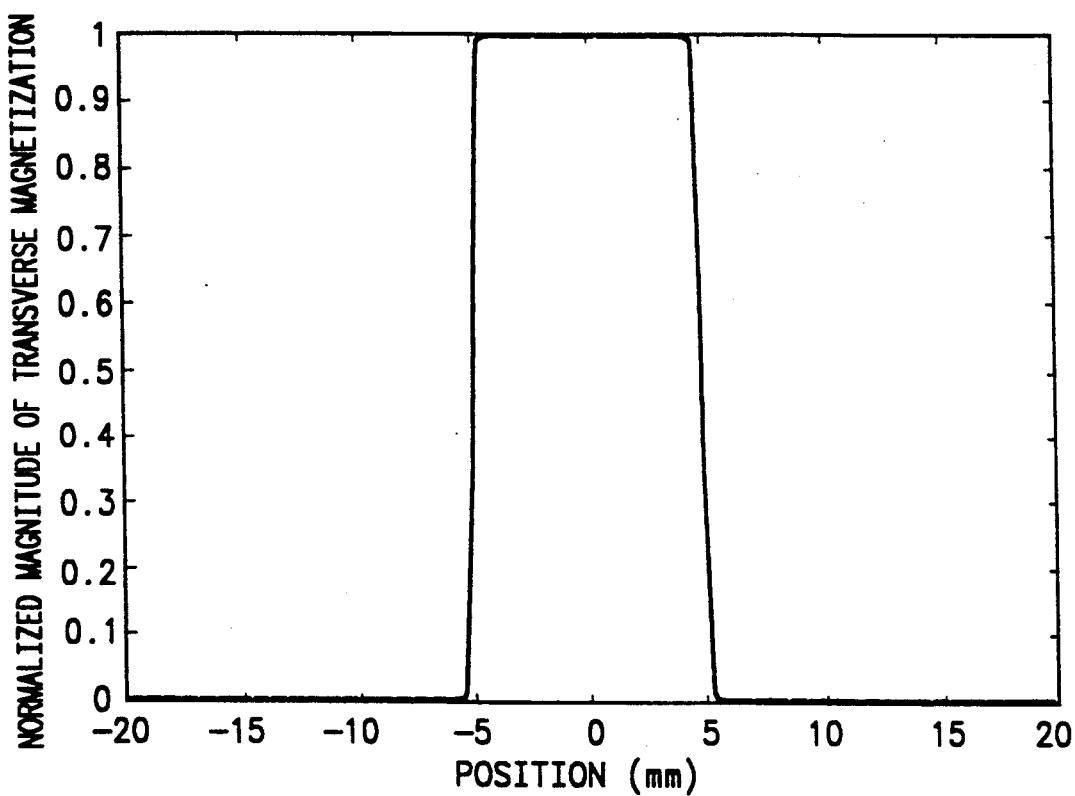
FIG. 2 is a plot of a simulated slice profile using the standard pulse.

Simulate the Bloch transform of this pulse and obtain its transverse magnetization slice profile shown in FIG. 2. The gradient strength in this simulation is chosen at 0.5 Gauss/cm. This profile, uncorrupted by any distortion, serves as the control for all subsequent results.

Figure 3:
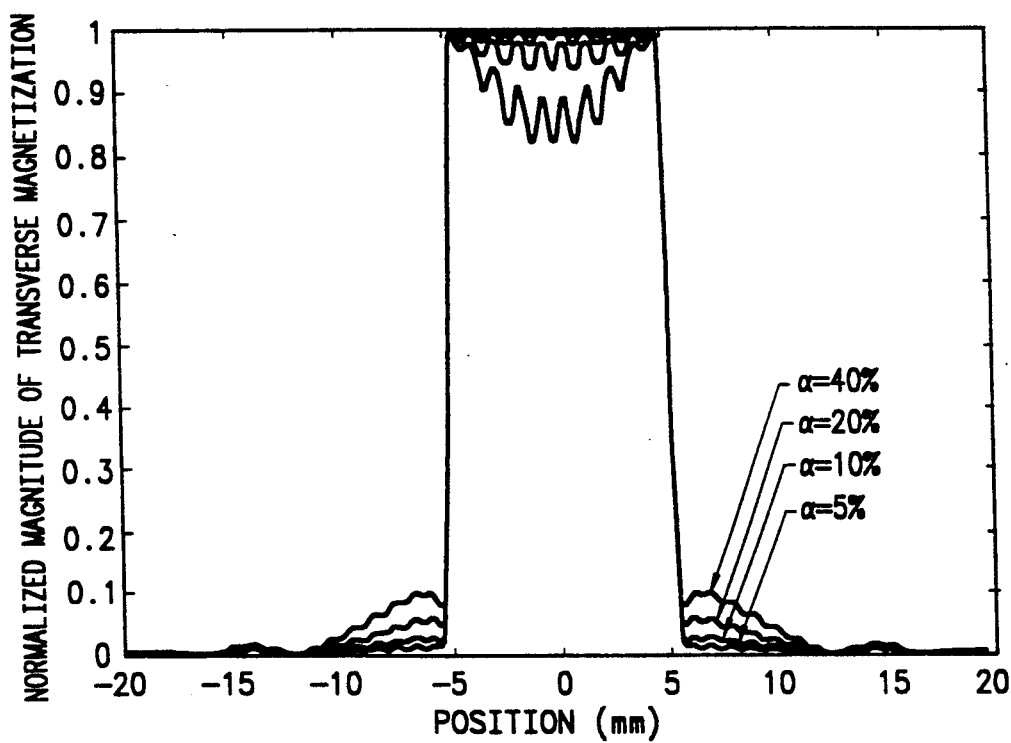
FIG. 3 is plots of simulated slice profiles distorted by nonlinearity in the selective-excitation pulse.

To emulate nonlinearity, consider a baseband gain function that has a linear loss of gain as the input magnitude increases. Ignoring incidental phase modulation, this hypothetical baseband gain function is, $$H(x_m) = 1 - \alpha \frac{x_m}{x_{max}} \quad [6]$$

where $x_{max}$ is the maximum magnitude of the pulse, and $\alpha$ is the loss of gain when $x_m$ is equal to $x_{max}$. The larger $\alpha$ is, the worse is the nonlinearity. Let us consider four baseband gain functions whose values of $\alpha$ are 5, 10, 20 and 40 percent. For each case, we multiply the baseband gain function to the standard pulse according to Eq. [5] and produce a distorted pulse. The simulated profiles of these distorted pulses are shown in FIG. 3.

Figure 4:
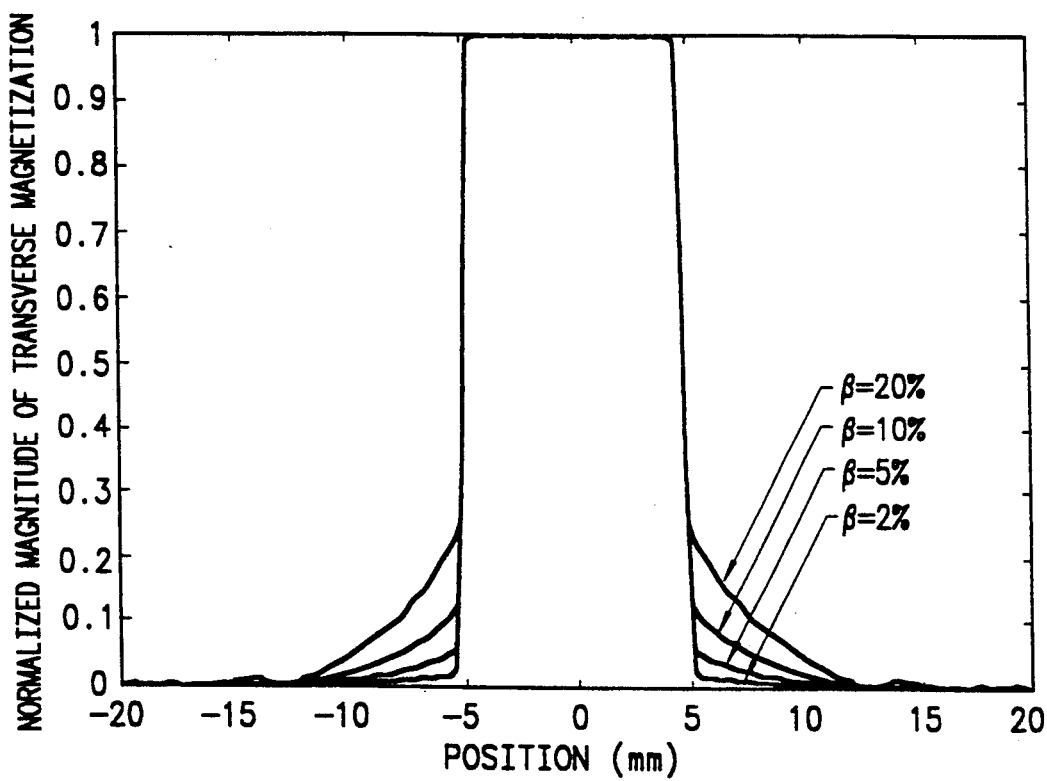
FIG. 4 is plots of simulated slice profiles distorted by incidental phase modulation of the selective-excitation pulse.

To emulate incidental phase modulation, consider a baseband gain function that has a linear increase in phase as the input magnitude increases. Ignoring nonlinearity, this hypothetical baseband gain function is, $$H(x_m) = \exp\left(i\beta \frac{x_m}{x_{max}}\right) \quad [7]$$

where $\beta$ is the phase shift when $x_m$ is equal to $x_{max}$. The greater $\beta$ is, the worse is the incidental phase modulation. Consider four baseband gain functions whose values of $\beta$ are 2, 5, 10, and 20 degrees, and again we calculate four distorted pulses. Their simulated profiles are shown in FIG. 4.

In these figures, note that as the distortion worsens (i.e. as $\alpha$ or $\beta$ increases), a "skirt" occurs in the out-of-slice region. The spatial extent of this skirt is about twice the slice width. A phase shift of 5 degrees produces a skirt approximately the same size as that made by a gain fluctuation of 10 percent. At this level of distortion, the height of the skirt is about 5 percent of the maximum magnetization. This skirt is a telltale sign of RF amplifier distortion, and it is seen again in the experimentally measured slice profile in FIG. 10. Interestingly, nonlinearity but not incidental phase modulation causes a dented profile in the in-slice region as seen in FIG. 3.

The origin of the skirt can be explained with a simple analysis. Assuming that the small-tip approximation applies, the transverse magnetization is proportional to the Fourier transform of the selective-excitation pulse, $$M_{xy}(z) = k_1 F\{y(k_2 t)\} \qquad [8]$$

where $k_1$ and $k_2$ are scaling constants. For convenience, let us consolidate both types of distortion by combining Eq. [6] and [7]. We have, $$H(x_m) = (1 - \alpha x_m) e^{i\beta x_m} \qquad [9]$$

where it is assumed that $x_{max}$ is equal to one. If $\alpha$ and $\beta$ are small, approximate Eq. [9] with, $$H(x_m) = (1 - \alpha x_m) + i\beta x_m \qquad [10]$$

where $\beta$ is specified in radians. Combining Eq. [5], [8] and [10] and rearranging, gives, $$M_{xy}(z) = k_1 F\{x(k_2 t)\} + k_1(-\alpha + i\beta) F\{x(k_2 t) | x(k_2 t)|\} \qquad [11].$$

The distorted slice profile can be interpreted as a superposition of an ideal profile and an error profile.

Since their Fourier transforms have different arguments, the ideal and the error profiles have different shapes. Furthermore, because the Fourier transform $F\{x(k_2 t) | x(k_2 t)|\}$ is equal to the convolution $F\{x(k_2 t)\} * F\{|x(k_2 t)|\}$, the spread of the error profile is greater than that of the ideal profile. Thus, the error profile always extends into the out-of-slice region. In fact, if the ideal profile were a rectangular function, then it can be shown that the error profile must be a smoothed triangular function with about twice the base width, which explains the occurrence of the skirt.

Equation [11] also explains why the slice profile in the in-slice region is predominantly influenced by nonlinearity while that in the out-of-slice region is influenced by both nonlinearity and incidental phase modulation. In the most common situation where the selective-excitation pulse is Hermitian (i.e. has complex-conjugate symmetry), both Fourier transforms $F\{x(k_2 t)\}$ and $F\{x(k_2 t) | x(k_2 t)|\}$ are real functions. If we define $M_i(z)$ as the magnitude of the ideal profile $k_1 F\{x(k_2 t)\}$ and $M_e(z)$ as the magnitude of the error profile $k_1 F\{x(k_2 t) | x(k_2 t)|\}$, then from Eq. [11] we can derive the following expression for the magnitude of the transverse magnetization, $$|M_{xy}(z)| = \sqrt{M_i(z)^2 - 2\alpha M_i(z) M_e(z) + (\alpha^2 + \beta^2) M_e(z)^2} \qquad [12]$$

Within the in-slice region, $M_i(z)$ is normally much greater than $M_e(z)$. Thus, the second term under the radical in Eq. [12] is much greater than the third term, and the effects of nonlinearity dominates the effects of incidental phase modulation. This explains why the in-slice dent occurs in FIG. 3 but not in FIG. 4. Within the out-of-slice region, on the other hand, $M_i(z)$ is equal to zero. Then only the third term in Eq. [12] is non-zero. Clearly, both nonlinearity and incidental phase modulation contribute equal damage. For example, a phase shift of 0.1 radian or 6 degrees would produce an error profile in the out-of-slice region as large as that from a gain fluctuation of 10 percent. Therefore, to reduce the skirt we must pay equal attention to control both types of distortion.

Equation [5] suggests that in order to measure the baseband gain function, one needs to control the baseband component of the amplifier input and to observe the baseband component of the amplifier output. The former involves modulating the carrier with a test signal, and this is readily accomplished by the transmitter in an MR imaging system. The latter involves demodulating the amplifier output signal, and this can be performed by connecting the amplifier output with proper impedance matching and signal attenuation, directly to the receiver.

Figure 5:
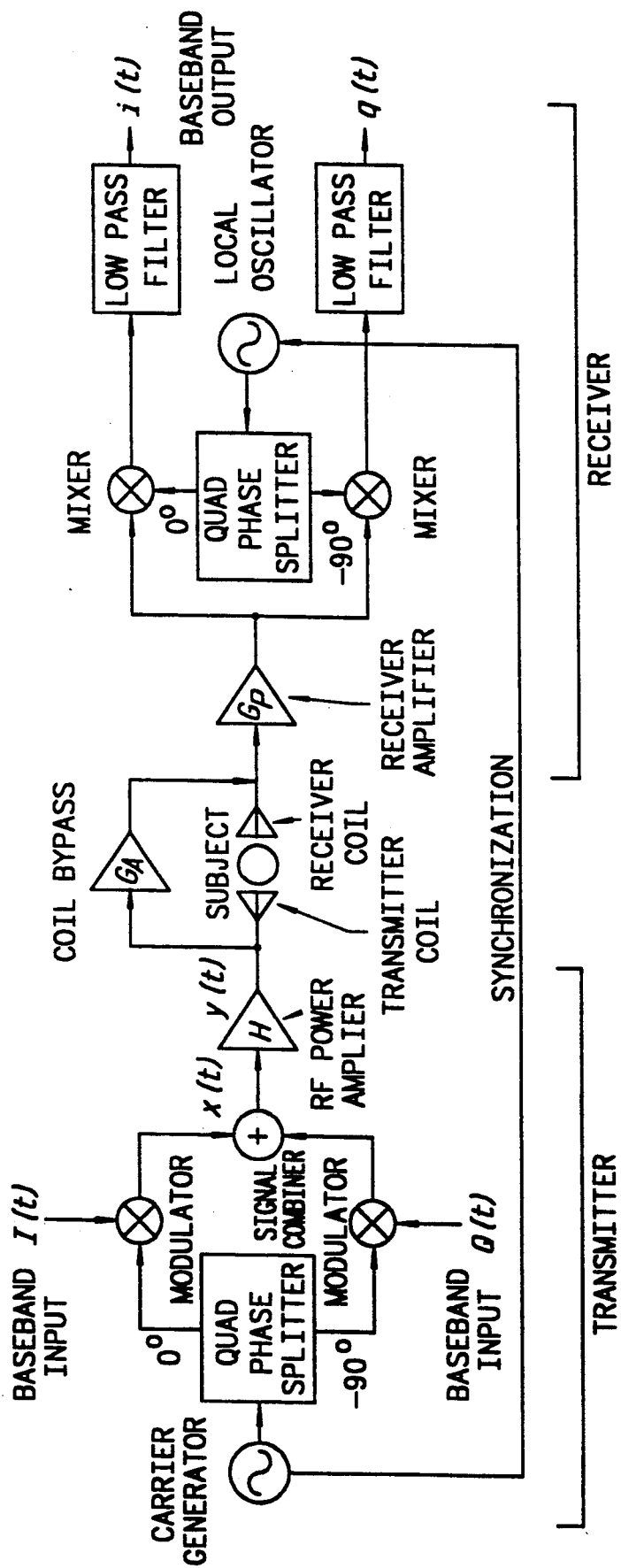
FIG. 5 is a block diagram of a quadrature amplitude modulation transceiver as used in MRI.

This measurement setup is illustrated in FIG. 5, which shows the block diagram of a generic QAM transceiver. The coil bypass is an attenuator, with a gain of $G_A$, that shunts the coil system and connects the output of the RF power amplifier to the input of the receiver amplifier. The receiver amplifier has a gain of $G_p$ and is assumed to be linear. The RF power amplifier has a baseband gain function H.

Define a transceiver input A(t) equal to I(t)+iQ(t) and a transceiver output a(t) equal to i(t)+iq(t). Using FIG. 5, one can derive an input-output relation for the transceiver, $$a(t) = \tfrac{1}{2} e^{i\phi_s} G_p G_A A(t) H(|A(t)|) \qquad [13]$$

where $\phi_s$ is the phase difference between the carrier generator and the local oscillator. In many applications like prewarping, one is interested in only the shape of the baseband gain function, not its absolute amplitude. We may omit the gain factors in Eq. [13], understanding that H is measured in a relative scale. Then Eq. [13] becomes, $$a(t) = H(|A|) A(t) \qquad [14].$$

To measure the baseband gain function, keep one channel (say, the imaginary channel Q(t)) of the transceiver input A(t) at zero while we sweep the other channel (say, the real channel I(t)) from zero to a maximum amplitude. Record the transceiver output a(t). Then H(I) is simply a divided by I. In practice, the rate of the sweep must be kept slow enough such that the entire transceiver, including the data collection system, can track the change.

Figure 6:
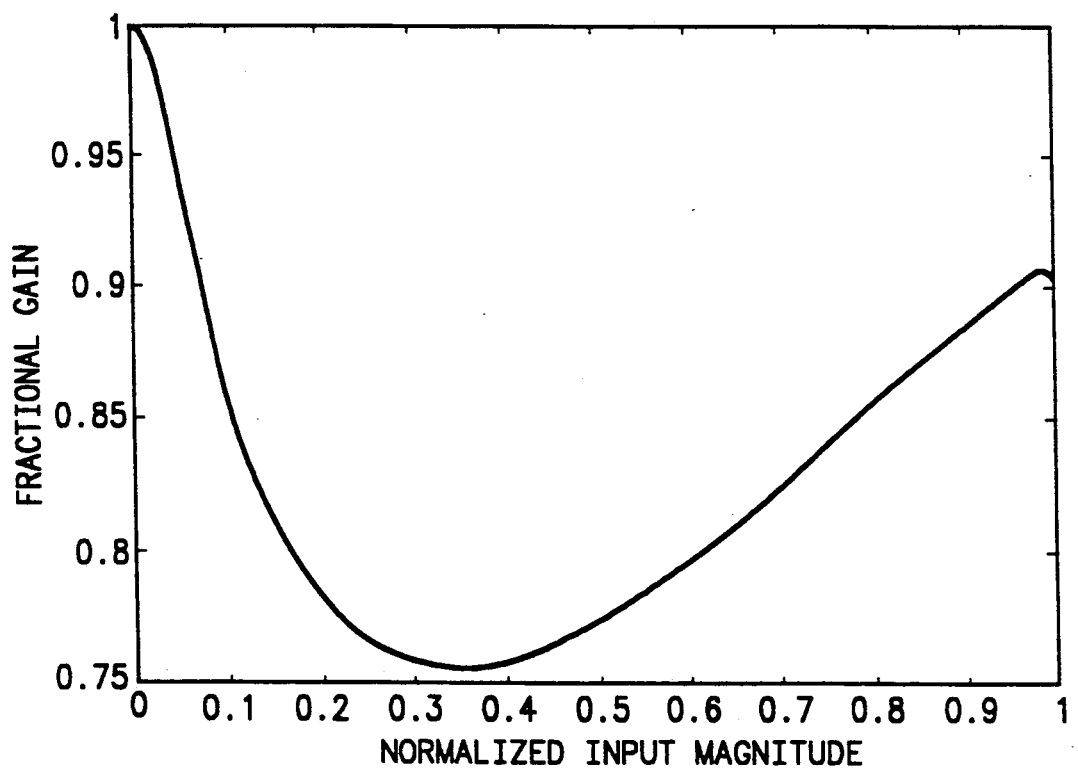
FIG. 6 is a plot of the magnitude component of a measured baseband gain function.
Figure 7:
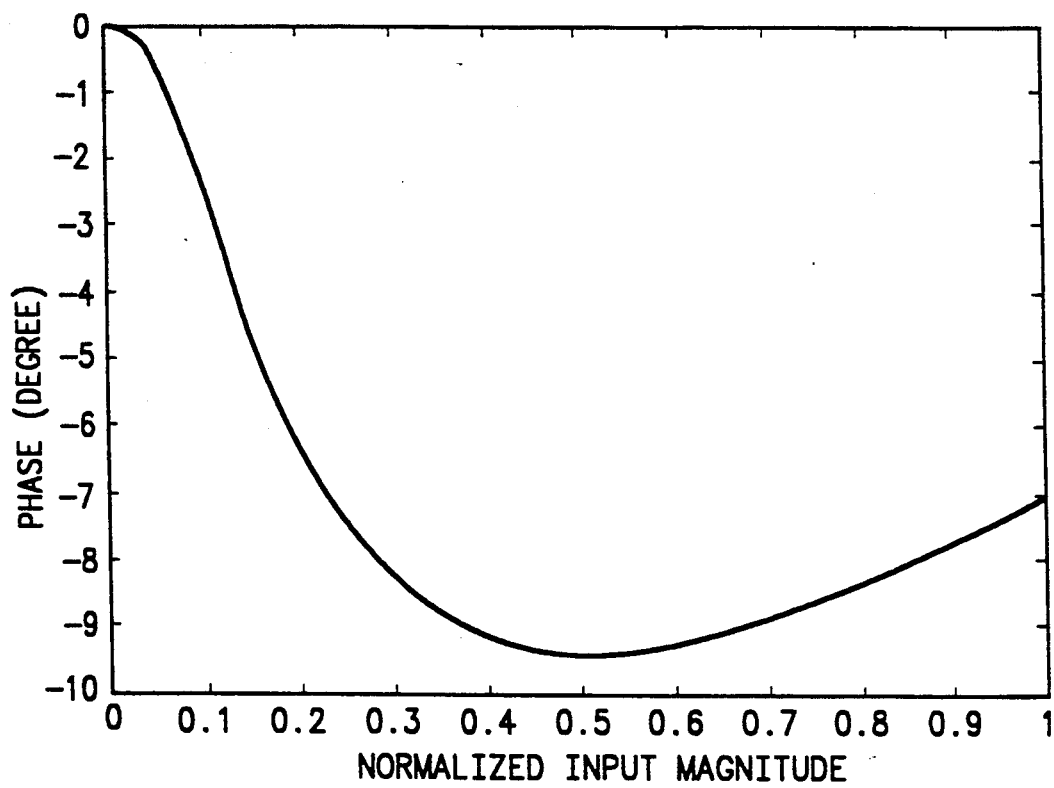
FIG. 7 is a plot of the phase component of a measured baseband gain function.

For illustration, this measurement was applied to a General Electric Signa MRI scanner, revision 3.2, located at the Magnetic Resonance Systems Research Laboratory (MRSRL) at Stanford. FIGS. 6 and 7 show the magnitude and phase components respectively of the baseband gain function. The gain fluctuation is about 25 percent while the phase shift is about 9 degrees. MRSRL normally disconnects a magnitude negative feedback mechanism to circumvents its limitation on the frequency response of the transmitter. For this reason, the amount of nonlinearity of our RF amplifier is unusually high compared with those in other clinical sites. However, the amount of phase shift recorded is typical of the Signa system of this revision.

The goal of prewarping is to find a predistorted pulse that is compensated for the distortion of the RF amplifier. The problem can be formally stated as following: given the desired baseband component y(t) of the amplifier output, what should be the appropriate baseband component x(t) of the amplifier input. We first define an inverted baseband gain function $H^{-1}$ which relates y(t) to x(t) as, $$x(t) = H^{-1}(y_m)y(t) \qquad [15]$$

where $y_m$ is the magnitude of y(t). Comparing Eq. [15] with Eq. [5], clearly the inverted function is, $$H^{-1}(y_m) = \frac{1}{H(x_m)} \qquad [16]$$

Computing the inverted function $H^{-1}$ takes more than reciprocating H because they have different arguments. Typically, some form of iteration is necessary but the inverted function $H^{-1}$ needs to be computed only once. Prewarping simply involves the evaluation of Eq. [15].

As a practical matter to consider, one normally does not know the exact level of Y(t) until prescan during which is found out how much energy is required to achieve a certain tip angle for a subject. Without y(t) one cannot prewarp, and without a prewarped pulse one cannot scan. To resolve this dilemma, first prescan a subject with the original pulse and record the input level needed to achieve the desired tip angle. Using Eq. [5], predict the distorted output from the amplifier. If y(t) is real and the phase shift due to incidental phase modulation is small, scale y(t) such that its time integrated area matches that of the distorted output. In doing so, the tip angle is preserved. Now with y(t) known, one can compute the prewarped pulse x(t). However, if y(t) is complex, this match-area algorithm does not work. But one can still approximately preserve the tip angle by matching the maximum amplitude of y(t) to that of the distorted output. In the limiting case where the magnitude component of the baseband gain function is constant (i.e. no nonlinearity), the results from the match-area algorithm and the match-amplitude algorithm converge.

$H^{-1}$ can be computed with an iterative procedure. However, when prewarping is implemented with a table lookup method, we do not need to compute $H^{-1}$ at all. But first, let us demonstrate how $H^{-1}$ can be computed with a simple-minded algorithm based on repeated substitution.

Let a nonnegative value $y_0$ be the argument of $H^{-1}(y_0)$ whose value we want to find. We define two intermediate variables $x_i$ and $H_i^{-1}$ whose values are improved with each iteration i. The iteration is stopped when the percentage change of $H_i^{-1}$ drops below a relative tolerance $\epsilon$. This percentage change, $\delta$, is defined as, $$\delta = \left| \frac{H_i^{-1} - H_{i-1}^{-1}}{H_i^{-1}} \right|. \qquad [17]$$

We perform the following steps, $x_0 \leftarrow y_0$
$H_0^{-1} \leftarrow 1/H(x_0)$
$i \leftarrow 0$
$\delta \leftarrow \epsilon$
while $\delta \geq \epsilon$ do
    $i \leftarrow i + 1$
    $x_i \leftarrow |H_{i-1}^{-1}|y_0$
    $H_i^{-1} \leftarrow 1/H(x_i)$
    $\delta = |(H_i^{-1} - H_{i-1}^{-1})/H_i^{-1}|$
end
$H^{-1}(y_0) \leftarrow H_i^{-1}$ We normally have a table of and not an analytical expression for H. In the above algorithm, when we evaluate H for an arbitrary argument $x_i$, we need to interpolate the samples of H.

Computing $H^{-1}$ is one way of doing prewarping, but not a very efficient way. A better approach makes use of a lookup table and a magnitude transfer function, $T_m$, defined as, $$T_m(x_m) = x_m |H(x_m)| \qquad [18].$$

For any useful amplifier, the transfer function must be a monotonously increasing function of $x_m$, and therefore, $T_m$ is a one-to-one map.

In this method, we first build a table with the following entries,

| I | i | q | $X_m$ | $T_m$ | $\angle H$ |
|---|---|---|---|---|---|
| 0.0 | 0.0 | 0.0 | 0.0 | 0.0 | — |
| . | . | . | . | . | . |
| . | . | . | . | . | . |
| . | . | . | . | . | . |
| 1.0 | | | 1.0 | 1.0 | |

The first three columns, I, i, and q are obtained from the measurement procedure of the baseband gain function (see the section Measurement of Distortion of the manuscript). The quantity I is the I-channel input of the transceiver while i and q are the outputs of the transceiver. They are assumed to be normalized such that the maximum input and output magnitudes are one. The fourth column $x_m$ has the same entries as the first column. The fifth column $T_m$, the magnitude transfer function, is set to the magnitude of the transceiver output, $$T_m = \sqrt{i^2 + q^2} . \qquad [19]$$

ps The sixth column $\angle H$, the phase of the baseband gain function, is set to the phase of the transceiver output, $$\angle H = \tan^{-1} \frac{q}{i} . \qquad [20]$$

Once we have built this table, we can perform prewarping with the following steps. Suppose y is one sample in the desired waveform y(t), and we want to find the corresponding sample x in the prewarped waveform x(t). We first decompose y in to a magnitude component $y_m$ and a phase component $\phi_y$. With $y_m$, we search the fifth column of the table to find the two entries that bracket $y_m$. We then look up the corresponding entries in the fourth column. Using linear or cubic spline interpolation, we compute the value $x_m$. Because $T_m$ is a one-to-one map, the uniqueness of $x_m$ is guaranteed. Now we look up the two entries in the sixth column. Again, using linear or cubic spline interpolations, we compute the value $\angle H$. Finally, we form x by, $$x = x_m \exp\{i(\phi_y - \angle H)\}. \quad [21].$$

The table lookup method processes the measured data i and q directly. There is no need to find the inverse baseband gain function $H^{-1}$ or even the magnitude component of the baseband gain function H. Thus, it is a very efficient implementation of prewarping.

Figure 8:
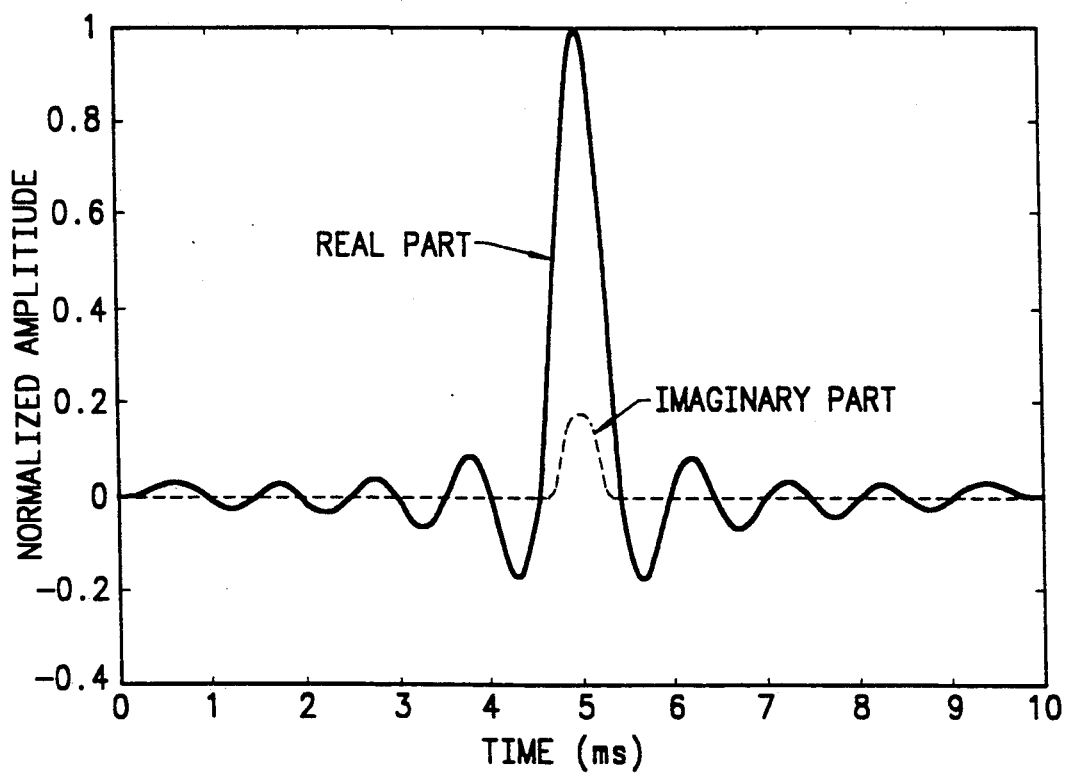
FIG. 8 is a plot of the standard pulse after prewarping.
Figure 9:
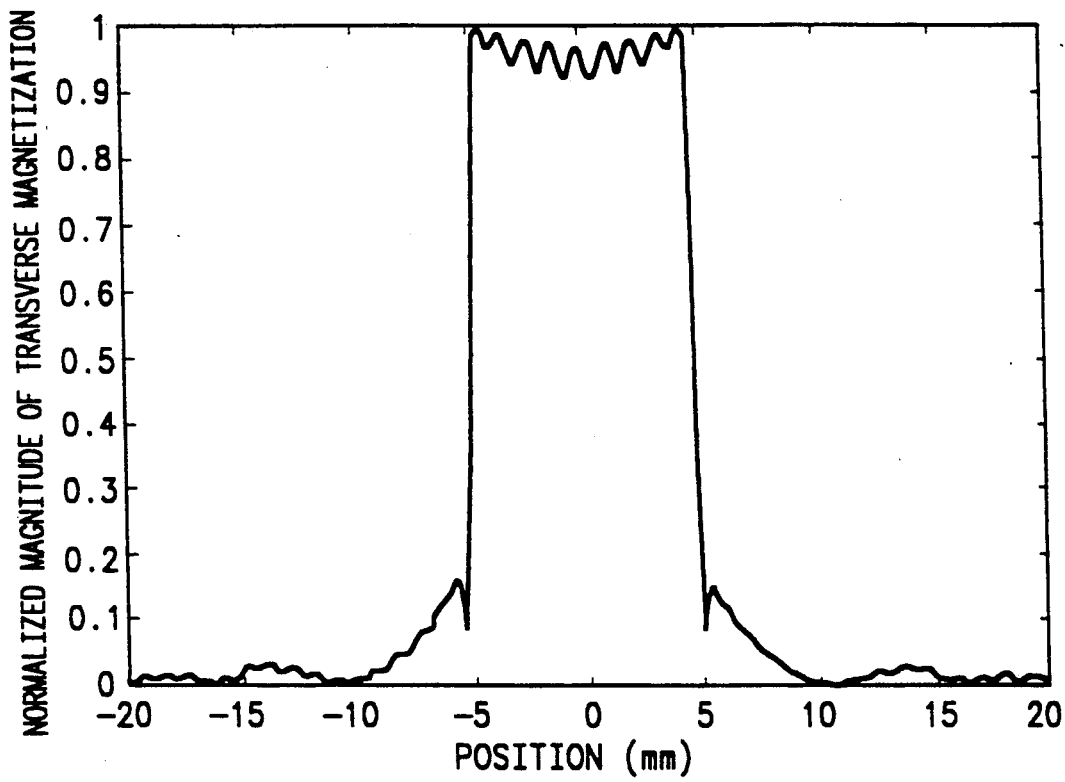
FIG. 9 is a plot of the measured slice profile of the standard pulse before prewarping.
Figure 10:
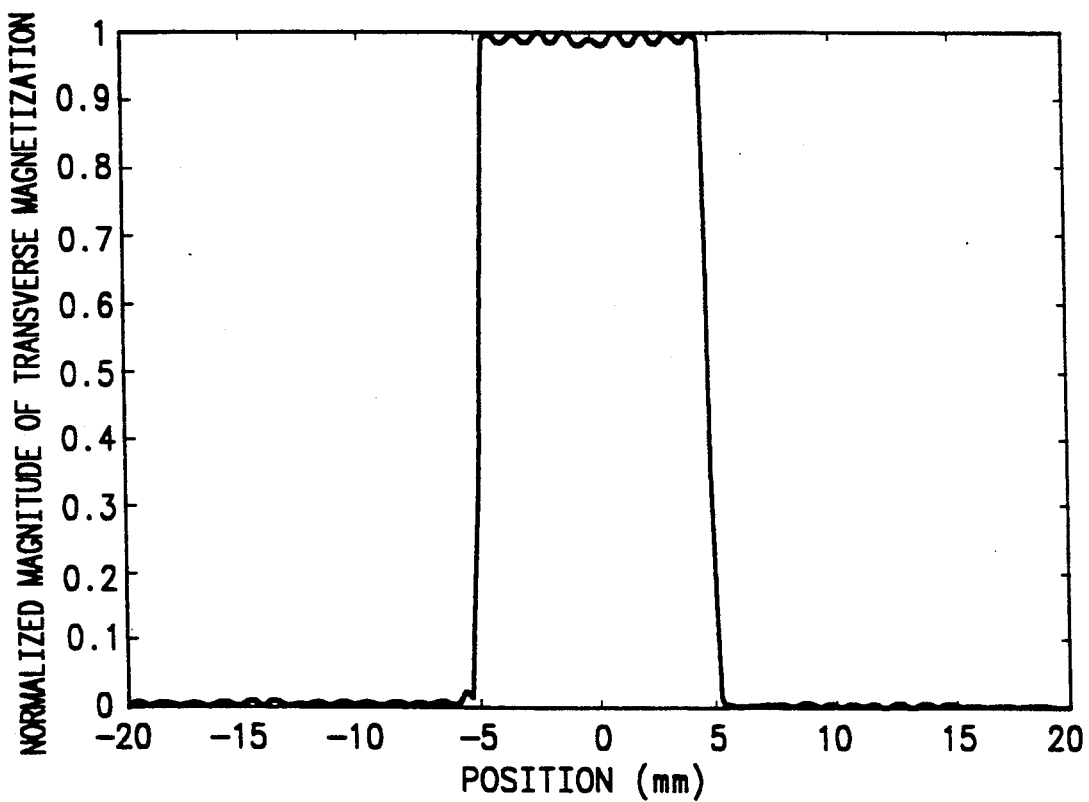
FIG. 10 is a plot of the measured slice profile of the standard pulse after prewarping.

To demonstrate the effects of prewarping, the slice profiles of the standard pulse on the Signa system at the MRSRL were measured with and without prewarping. FIG. 8 shows the prewarped pulse. Comparing FIG. 8 with FIG. 1, we notice a small blip in the imaginary component of the rewarped pulse. This blip serves to compensate for the incidental phase modulation. FIG. 9 shows the measure profile of the standard pulse without prewarping. As expected, a skirt appears prominently at the base of the slice. FIG. 10 shows the measured profile of the standard pulse with prewarping. The skirt is effectively eliminated and the ideal profile is restored.

The above measurements are carried out with a standard spin echo sequence where the image is projected along both the x-axis and the y-axis. The RF signal is transmitted and received through a whole-body coil. The phantom is a 500 ml rectangular vial filled with 6.17 mM $CuSO_4$ solution, whose T1 and T2 are measured to be 250 ms and 140 ms respectively. The sequence repetition time TR is 500 ms and the echo time TE is about 30 ms. The selective-gradient strength is 0.5 G/cm. Thirty-two excitations are accumulated before reconstruction. The field of view is 4 cm and there are 256 samples, which give a resolution of 0.16 mm.

As method of distortion correction, prewarping is especially suited for MR systems. Firstly, the fact that the signal transmitted by an MR transceiver is highly repetitive makes prewarping economical: an RF pulse, once prewarped, is used over and over again during a scan. In addition, we can easily prewarp and store a family of pulses at different output levels beforehand and select the appropriate one for a particular scan. Secondly, prewarping can be implemented entirely in software, and therefore incurs no hardware cost. Thirdly, as we have seen the existing transceiver can be adapted, with minimal changes, to measure the baseband gain function. Finally and most importantly, compared with other distortion control measures like negative feedback, prewarping incurs no performance penalties, such as gain loss, instability, and band limitation. Prewarping does require some maintenance: as the characteristics of te RF amplifier drift, the baseband gain function must be measure over again. But for any reasonably stable system, the need for re-measurement should occur infrequently.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

I claim:

1. In a magnetic resonance imaging system, a method of improving slice definition in imaging comprising the steps of generating an RF signal by modulating a carrier signal with a baseband selective-excitation pulse for selectively energizing a slice of an object in accordance with the equation $$\omega_0 = B_0 \cdot \gamma$$

where
$\omega_0$ = angular frequency of said RF signal,
$B_0$ = magnetic field through said slice,
$\gamma$ = magnetogyric ratio amplifying said RF signal,
determining distortion of said RF signal after amplification, and
predistorting said selective-excitation pulse to offset distortion by amplifying said RF signal.

2. The method as defined by claim 1 wherein said step of determining distortion includes demodulating said RF signal after amplification.

3. The method as defined by claim 2 wherein said baseband signal includes an in-phase component and a quadrature-phase component.

4. The method as defined by claim 3 wherein said RF signal is generated by using one of the in-phase and quadrature-phase components in modulating said carrier signal and said step of determining distortion includes determining nonlinearity and incidental phase modulation.

5. The method as defined by claim 4 wherein said steps of generating an RF signal, determining distortion, and predistorting said RF signal are iterative.

6. The method as defined by claim 4 wherein said steps of generating an RF signal, determining distortion, and predistorting said RF signal utilizes a look-up table of a magnitude transfer function and phase of the baseband gain function.

7. The method as defined by claim 4 wherein said steps of generating an RF signal includes sweeping the RF signal from zero to a maximum amplitude.

8. The method as defined by claim 4 wherein said steps of generating an RF signal includes repetitive sweeping the RF signal to obtain time-dependant characteristics of the baseband gain function.

9. In a magnetic resonance imaging system including a modulator for modulating an RF carrier with a baseband input signal, an RF power amplifier, and a receiver including a demodulator for demodulating RF signals, a method of pre-warping the baseband input signal to offset RF amplifier signal distortions comprising the steps of generating an RF signal for selectively energizing an object in accordance with the equation $$\omega_0 = B_0 \cdot \gamma$$

including modulating a carrier signal with a baseband signal,
amplifying said RF signal,
determining distortion of said RF signal after amplification including demodulating said RF signal after amplification, and
predistorting said baseband signal to offset distortion by amplifying said RF signal.

10. The method as defined by claim 9 wherein said baseband signal includes an in-phase component and a quadrature-phase component, said RF signal being generated by using one of the in-phase and quadrature-phase components in modulating said carrier signal.

11. The method as defined by claim 8 wherein said steps of generating an RF signal includes sweeping the RF signal from zero to a maximum amplitude.

12. The method as defined by claim 9 wherein said steps of generating an RF signal, determining distortion, and predistorting said RF signal are iterative.

13. The method as defined by claim 11 wherein said steps of generating an RF signal, determining distortion, and predistorting said RF signal utilizes a look-up table of a magnitude transfer function and phase of the baseband gain function.

14. The method as defined by claim 10 wherein said steps of generating an RF signal includes repetitive sweeping the RF signal to obtain time-dependant characteristics of the baseband gain function.

15. The method as defined by claim 9 wherein the output of said RF power amplifier is connected through attenuation means to said receiver before said step of generating an RF signal.

* * * * *